United States Patent [19]

Seifcak

[11] Patent Number: 5,574,444
[45] Date of Patent: Nov. 12, 1996

[54] METHOD AND APPARATUS FOR DECODING SIGNALS CONTAINING ENCODED INFORMATION

[75] Inventor: Paul Seifcak, Houston, Tex.

[73] Assignee: Mitsubishi Caterpillar Forklift America Inc., Houston, Tex.

[21] Appl. No.: 388,391

[22] Filed: Feb. 14, 1995

[51] Int. Cl.⁶ .................................................. H03M 1/12
[52] U.S. Cl. ................................................ 341/1; 341/144
[58] Field of Search ............................. 341/1, 6, 11, 144, 341/152; 375/22

[56] References Cited

U.S. PATENT DOCUMENTS

| | | | |
|---|---|---|---|
| 5,233,405 | 8/1993 | Wildnauer et al. | 356/333 |
| 5,280,603 | 1/1996 | Jeppson et al. | 395/425 |

Primary Examiner—Brian K. Young
Attorney, Agent, or Firm—Fish & Richardson P.C.

[57] ABSTRACT

A signal converter for use with a moveable mechanical device includes input means for receiving a multi-bit digital signal indicative of a position of the moveable mechanical device, a processor having means for converting the multi-bit digital signal into a pulse-width modulated signal, and a low-pass filter that creates an analog voltage corresponding to the position of the moveable mechanical device from the pulse-width modulated signal. A method of creating an analog voltage corresponding to a position of a moveable mechanical device includes the steps of receiving a multi-bit digital signal indicative of the position of the moveable mechanical device, converting the multi-bit digital signal into a pulse-width modulated signal, and creating an analog voltage corresponding to the position of the moveable mechanical device by filtering the pulse-width modulated signal.

19 Claims, 11 Drawing Sheets

(CONTINUED ON PAGE 5)

5,574,444

METHOD AND APPARATUS FOR DECODING SIGNALS CONTAINING ENCODED INFORMATION

FIELD OF THE INVENTION

The invention relates, in general, to signal conversion and, more particularly, to decoding signals carrying encoded information.

BACKGROUND OF THE INVENTION

The operation of many electronic and mechanical devices is dependent upon the physical location or position of another device. For example, the speed of a vehicle is generally controlled by an accelerator, the output of which depends upon the linear position of an accelerator pedal. In traditional acceleration control mechanisms, the pedal is connected electrically, mechanically, or both, to an accelerator controller. As the vehicle operator moves (e.g., presses or releases) the pedal, the accelerator increases or decreases the speed of the vehicle in a manner directly related to the movement. In pursuit of safety and ease of use, designers in the art have sought to develop acceleration mechanisms which control the speed of the vehicle with a high degree of precision in relation to the location of the pedal.

FIGS. 1A and 1B show one of the most primitive, yet most widely used, acceleration control mechanisms. In FIG. 1A, an accelerator pedal 22 has a leg 20 which mechanically contacts the wiper shaft 24 of a multi-turn potentiometer 26. As the pedal 22 is depressed or released, the motion of the leg 20 causes the wiper shaft 24 to rotate. As shown in FIG. 1B, when the wiper shaft 24 rotates, the wiper 28 of the potentiometer 26 moves between the ends 30a and 30b of the resistive element 30 within the potentiometer 26. Because the resistive element 30 is connected between the positive and negative leads of a DC voltage source, the motion of the wiper 28 causes the potentiometer 26 to output a DC voltage level corresponding to the linear position of the pedal leg 20. The output DC voltage level is input to an electronic accelerator and is used to control the speed of the vehicle.

The relationship between pedal position and vehicle speed is relatively imprecise with the acceleration control mechanism of FIGS. 1A and 1B. The linear position encoder 40 of FIG. 2 attempts to solve this problem. The linear position encoder 40 attaches directly to the accelerator pedal (not shown) and outputs a digital signal that indicates the position of the pedal. A shaft 42 extending from the linear position encoder 40 connects at one end to the pedal, enters the housing 44 of the encoder 40 and connects at the other end to a slidable body 46 within the encoder 40. Several vanes 48 extend perpendicularly away from the body 46 along linear tracks 50. Optical switches 52 mounted to the housing 44 also lie along linear tracks 50. Each optical switch includes a signal generating source (e.g., a light emitting diode, or LED) 56 and a signal receiver (e.g., a photo-transistor) 58 separated by a passageway 54.

In operation, the LED 56 generates an infrared signal which is detected by the photo-transistor 58. As long as the infrared signal emitted by the LED 56 is detected by the photo-transistor 58, the photo-transistor 58 conducts in saturation. When the pedal is depressed and released, however, the slidable body 46 moves through the housing 44, causing the vanes 48 to move through the passageways 54 in the optical switches 52. As the vanes 48 protrude into the passageways 54, the infrared signal from the LED 56 is interrupted and thus is not received at the photo-transistor 58, thus causing the photo-transistor to cease conducting.

As shown in FIG. 3, the collector 58a of each photo-transistor 58 is tied to the high voltage lead 60a of a power supply 60. When the photo-transistor 58 receives the infrared signal and conducts in saturation, the emitter 58b is pulled to a high voltage, as is one input 62a of a logic AND gate 62. Because input 62b of the AND gate 62 is always tied to the high voltage lead 60a of the power supply 60, the AND gate 62 outputs a high voltage that drives the base of output transistor 64. The emitter 64a of the output transistor 64 is tied to the low voltage lead 60b of the power supply 60, so when the transistor 64 conducts in saturation, the collector 64b, and the thus the corresponding output bit of the linear position encoder, is pulled to a low voltage. Therefore, uninterrupted signal detection in the optical switch 52 produces a low voltage output signal.

When the passageway between the LED 56 and the photo-transistor 58 is blocked and the photo-transistor 58 ceases to conduct, a pull-down resistor 66 pulls input lead 62a to a low voltage, thereby pulling the output of the AND gate 62 low and turning off the output transistor 64. As a result, the output collector 64b, which is normally tied to a pull-up resistor (not shown), produces a high voltage at the corresponding output 67 of the linear position encoder 40.

The linear position encoder 40 of FIGS. 2 and 3 has four optical switches 52 and thus has four output transistors 64. Because each transistor 64 outputs either a high or a low voltage, the output of the linear position encoder 40 is a 4-bit digital signal. The pattern of bits in the digital signal depends upon the position of the vanes 48 in relation to the optical switches 52. When the accelerator pedal is fully released and the shaft 42 of the encoder 40 is fully extended, the slidable body 46 abuts the end 68 of the encoder 40 near the accelerator pedal. When the pedal is in this position, a vane 48 along each of the linear tracks 50 protrudes into the passageway 54 of the corresponding optical switch, so none of the switches 52 conducts. The resulting output from the encoder is a digital signal in which all bits are high.

As the pedal is depressed, the vanes begin to exit and reenter the passageways 54 in such a manner that the optical switches 52 cease and then resume conducting in a predetermined pattern. As a result, the bits in the digital output of the encoder 40 change as the pedal is depressed, as the slidable body 46 moves through the housing 44, and as the vanes 48 move through the passageways 54 of the optical switches 52.

The pattern of vanes across the linear tracks 50 and within each linear track 50 is such that only one optical switch 52 changes its conductive state at any given time. In other words, two optical switches cannot begin to conduct or cease to conduct at the same time, nor can one optical switch 52 begin to conduct at the same time another optical switch 52 ceases to conduct. Such a vane pattern enables the encoder 40 to output a digital signal that follows a gray code, i.e., one in which only one bit changes at a time. Gray codes are well-known in the art and will not be described herein. Additional description of the linear position encoder of FIGS. 2 and 3 is provided in Appendix A.

While the accelerator control mechanism of FIGS. 2 and 3 generates more precise acceleration control output, it is not compatible with analog accelerators. This characteristic is particularly problematic because analog accelerators are less expensive and more widely available than the digital accelerators that must be used with the linear position encoder. An example of a widely used analog accelerator is Spectrol Pot Model No. 961-1.

The linear position encoder also presents a problem when one of the output bits, either through failure of an optical switch or the corresponding output circuit, becomes an open-circuit. When this happens, the digital accelerator either shuts the vehicle down permanently or controls the speed of the vehicle in a manner unrelated to the position of the pedal. The former is undesirable because the vehicle becomes useless until the problem is found, and the latter is undesirable because the accelerator control mechanism becomes unpredictable and endangers the operator's safety.

SUMMARY OF THE INVENTION

In general, in one aspect, the invention relates to a signal converter for use with a moveable mechanical device, comprising input means for receiving a multi-bit digital signal indicative of a position of the moveable mechanical device; a processor comprising means for converting the multi-bit digital signal into a pulse-width modulated signal; and a low-pass filter operable to create an analog voltage from the pulse-width modulated signal, the analog voltage corresponding to the position of the moveable mechanical device.

Embodiments of the invention include the following features. The signal converter may include memory means for storing data characteristic of the multi-bit digital signal. The data characteristic of the multi-bit digital signal may include a table of binary codes corresponding to all of a plurality of recognizable positions of the moveable mechanical device. The processor may include means for interpreting the data characteristic of the multi-bit digital signal and means for using the interpreted data to create the pulse-width modulated signal. The signal converter may include an undervoltage detector operable to indicate when the analog voltage falls below a threshold voltage level.

In general, in another aspect, the invention relates to an electronic decoder for use with a position encoder, the position encoder producing a multi-bit digital code corresponding to a position of a mechanical device, the decoder comprising input means for receiving the multi-bit digital code; a processor comprising pulse-width modulation means for converting the digital code into a pulse-width modulated signal, the pulse-width modulated signal having a period with a duty cycle corresponding to the position of the mechanical device; and a low-pass filter operable to create from the pulse-width modulated signal a decoded analog voltage corresponding to the position of the mechanical device.

Embodiments of the invention include the following features. The electronic decoder may encode $2^x$ positions, each of the positions represented by a distinct x-bit digital signal, x being an integer greater than zero, the period of the pulse-width modulated signal having one of $2^x$ possible duty cycles, each of the $2^x$ possible duty cycles corresponding to one of the $2^x$ linear positions. The electronic decoder may include a memory device containing data characteristic of the position of the mechanical device, wherein the processor comprises means for determining the position from the multi-bit digital code; means for retrieving from the memory device the characteristic data for the position; and means for using the characteristic data to create the pulse-width modulated signal. The position may be an off position, and the decoder may include means for disabling another electronic device when a multi-bit code corresponding to the off position is decoded. The processor may include means for detecting an erroneous bit pattern in the multi-bit digital code; means for determining if the erroneous bit pattern contains an open-circuited bit; means for defining a new position of the mechanical device when the erroneous bit pattern contains an open-circuited bit; means for storing data characteristic of the new position; and means for producing the pulse-width modulated signal from the data characteristic of the new position.

In general, in another aspect, the invention relates to a method of creating an analog voltage corresponding to a position of a moveable mechanical device, comprising receiving a multi-bit digital signal indicative of the position of the moveable mechanical device; converting the multi-bit digital signal into a pulse-width modulated signal; and creating an analog voltage by filtering the pulse-width modulated signal, the analog voltage corresponding to the position of the moveable mechanical device.

Embodiments of the invention include the following features. The method may include storing data characteristic of the multi-bit digital signal in a memory device, the data comprising a table of binary codes corresponding to all of a plurality of recognizable positions of the moveable mechanical device. The step of converting the multi-bit digital signal into a pulse-width modulated signal may include interpreting the data characteristic of the multi-bit digital signal and using the interpreted data to create the pulse-width modulated signal.

In general, in another aspect, the invention relates to a method of compensating for open-circuited bits in bit patterns output by a multi-bit position encoding device, each bit pattern representing a position of a mechanical device, the method comprising detecting a bit pattern which deviates from expected bit patterns; finding an open-circuited bit in the deviating bit pattern; and defining new positions corresponding to bit patterns having the open-circuited bit.

Embodiments of the invention include the following features. The step of detecting may include comparing the bit pattern with a table of expected bit patterns stored in a memory device. The step of finding may include reading a plurality of deviating bit patterns and comparing each of the plurality of deviating bit patterns to at least one table of expected erroneous bit patterns. The step of defining may include retrieving from a memory device a table of bit patterns expected when the open-circuited bit is open-circuited. The method may include storing in a memory device data characteristic of each of the new positions, the data being used to create a pulse-width modulated signal when the new positions are encoded by the position encoding device.

In general, in another aspect, the invention relates to a method of controlling speed of a vehicle, the vehicle having an accelerator pedal which causes the vehicle to accelerate when depressed and to decelerate when released to a speed corresponding to a position of said pedal, the method comprising creating a digital signal having a plurality of digital bits representative of the position of the pedal; comparing the digital signal to an expected signal; if the digital signal does not match the expected signal: determining which of the plurality of digital bits is incorrect, and selecting one of a plurality of sets of data, the sets of data each containing speed control data accessible only when a corresponding bit in the digital signal is incorrect; if the digital signal does match the expected signal, selecting another set of data, the other set of data containing speed control data accessible only when each of the bits in the digital signal is correct; creating a pulse-width modulated signal according to the selected set of data; filtering the pulse-width modulated signal into an output DC voltage level corresponding to the position of the pedal; and applying the output DC voltage level to an electronic accelerator to control the speed of the vehicle.

Among the advantages of the invention are the following. The invention may be used with a linear position encoder to precisely convert the multi-bit digital output of the encoder into a PWM signal and an analog signal. In a vehicle acceleration control application, this allows the performance benefits of the linear position encoder to be combined with the financial benefits of an analog accelerator. The invention also eliminates many of the problems which arise when an output bit of the linear position encoder becomes open-circuited. Thus, in vehicle speed control applications, the vehicle may be used in a proper, predictable and safe manner even when a bit in the output of the linear position encoder fails.

Other advantages of the invention will become apparent from the following description and from the claims.

BRIEF DESCRIPTION OF THE DRAWINGS

Embodiments of the invention are described in detail herein with reference to the following drawings.

DESCRIPTION OF THE PREFERRED EMBODIMENTS

Figure 4:
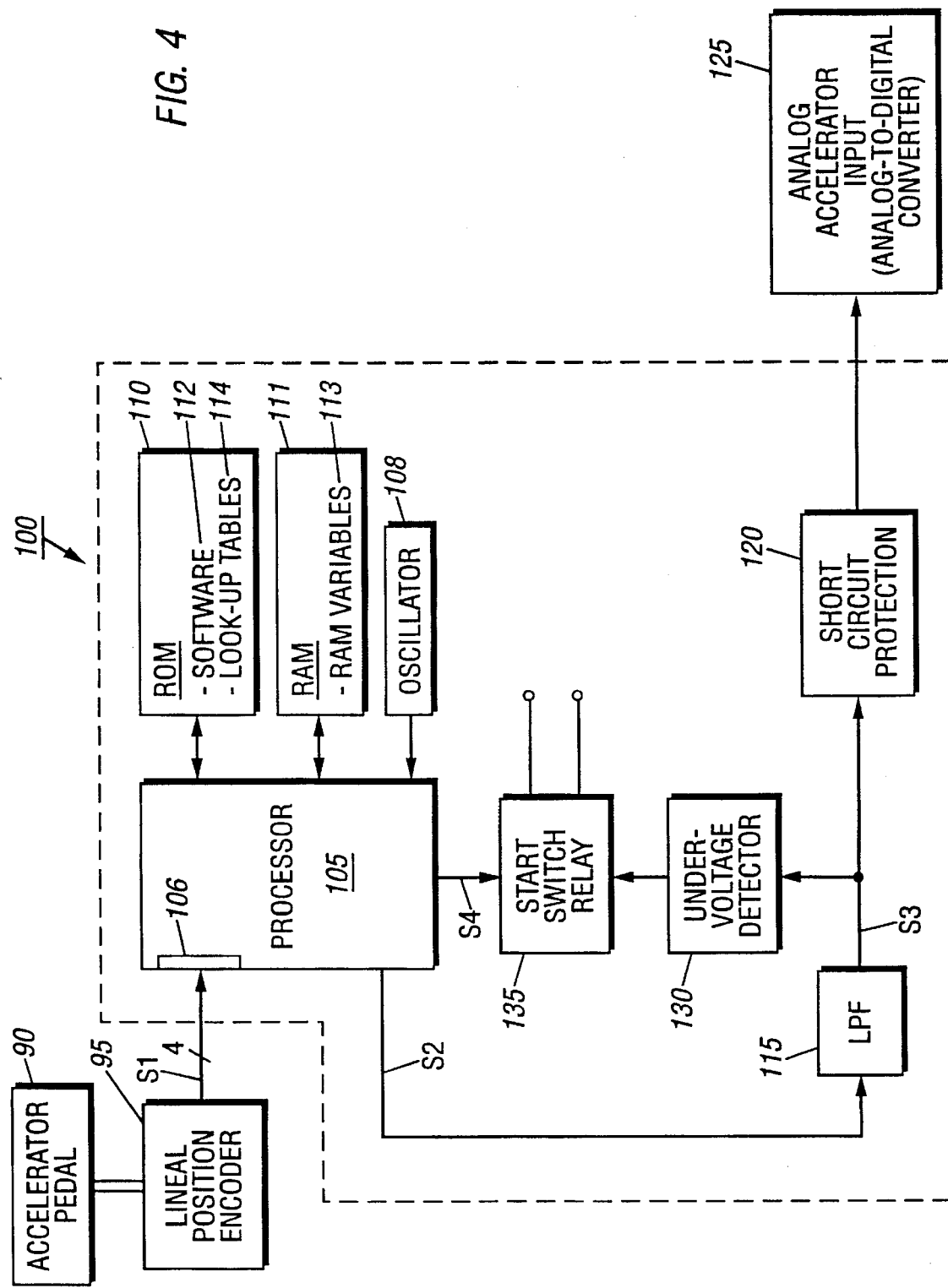
FIG. 4 is a functional block diagram of an acceleration control mechanism according to the invention.

Referring to FIG. 4, a signal conversion circuit is embodied in the form of a vehicle accelerator controller 100. The acceleration pedal 90 of the vehicle is connected to a linear position encoder 95, like the one described above. Linear position encoder 95 outputs a multi-bit digital signal S1 to an input port 106 of a processor 105 within the accelerator controller 100. The digital signal S1 encodes the linear position of the accelerator pedal 90.

The processor 105, which is driven by an oscillator 108, periodically reads the digital signal S1. Using software 112 stored in read only memory (ROM) 110, the processor 105 accesses look-up tables 114 (also stored in ROM 110) to retrieve data that allows the processor 105 to create an output signal S2 which uniquely represents the linear position of the accelerator pedal 90. The signal S2 is a pulse-width modulated (PWM) signal whose duty cycle is directly related to the position of the accelerator pedal 90. In general, the PWM signal is a square wave in which the ratio of "high" time to "low" time (duty cycle) is predetermined. According to the invention, the duty of the PWM signal contains specific information obtained from an encoding source.

The PWM signal S2 is converted into an analog signal S3 by a low-pass filter 115. The low-pass filter 115 averages the voltage level of the signal over the course of each cycle. The analog signal S3 is thus a DC signal whose voltage level at any given time is uniquely related to the position of the accelerator pedal 90. The analog signal S3 passes through a short-circuit protection circuit 120 and is output from the accelerator controller 100 to an analog accelerator input 125, such as General Electric's EV100 ZX panel. The short circuit protection circuit 120 prevents damage to any of the accelerator controller circuitry in the event that the vehicle battery voltage, which often exceeds the voltage ratings of the electronic components, is accidently connected to the output of the accelerator controller 100.

A General Electric accelerator running on a +5 V power supply requires an input voltage level of between 0.1 V and 3.7 V, the former indicating a fully depressed accelerator pedal, and the latter indicating a fully released pedal. To ensure that the input voltage to the accelerator 125 remains at a safe level, the analog signal S3 is monitored by an undervoltage detecting circuit 130. When the voltage level of signal S3 falls below a predetermined threshold value (approximately 0.2 V for a 5 V system), the undervoltage detector 130 cuts off a relay 135 which, when held on by the processor 105, enables operation of the start switch of the vehicle (not shown). The undervoltage detector 130 thus disables the vehicle when the output signal S3 falls to a dangerously low level.

Figure 5:
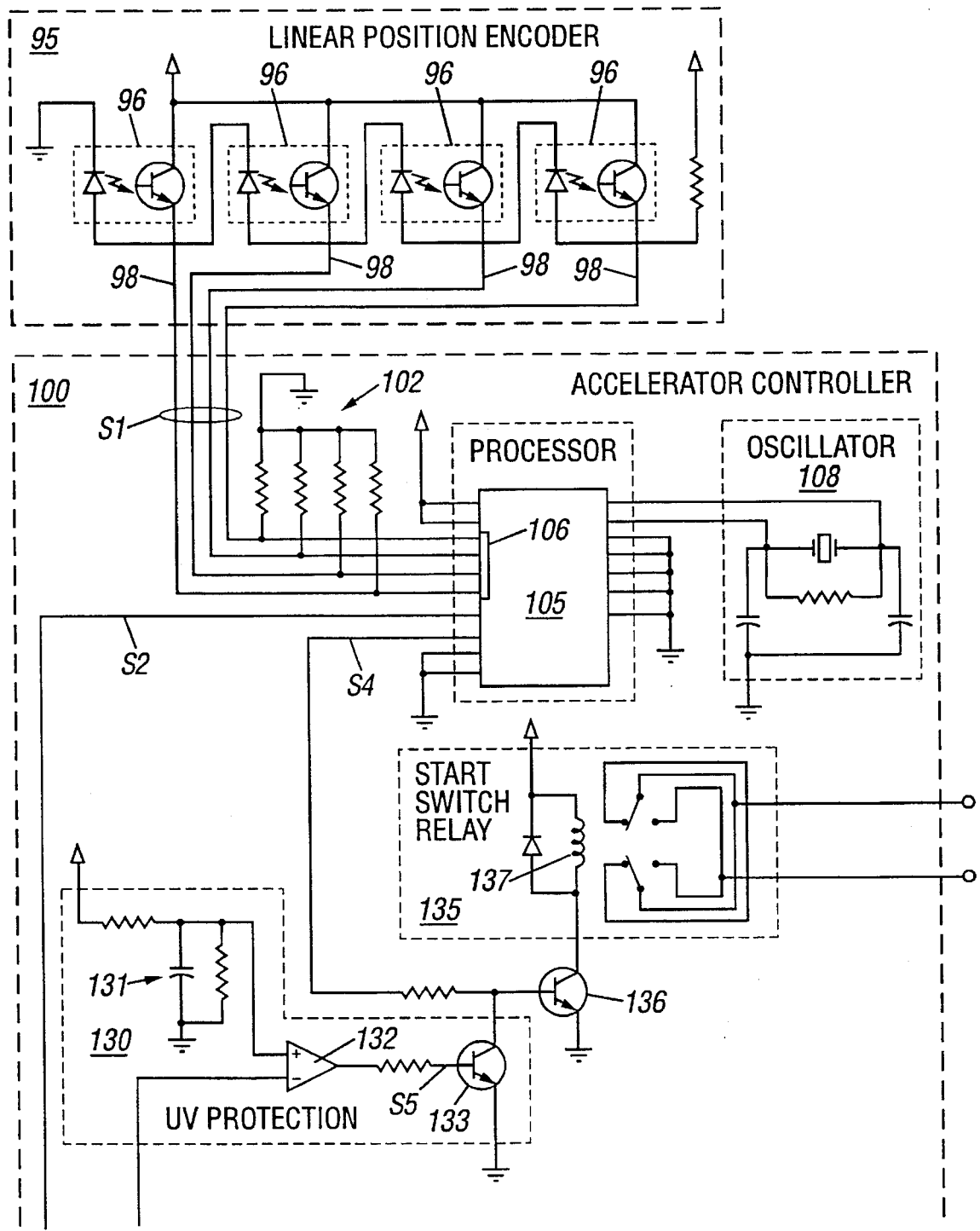
FIG. 5 is a schematic diagram of the acceleration control mechanism of FIG. 4.
Figure 5:
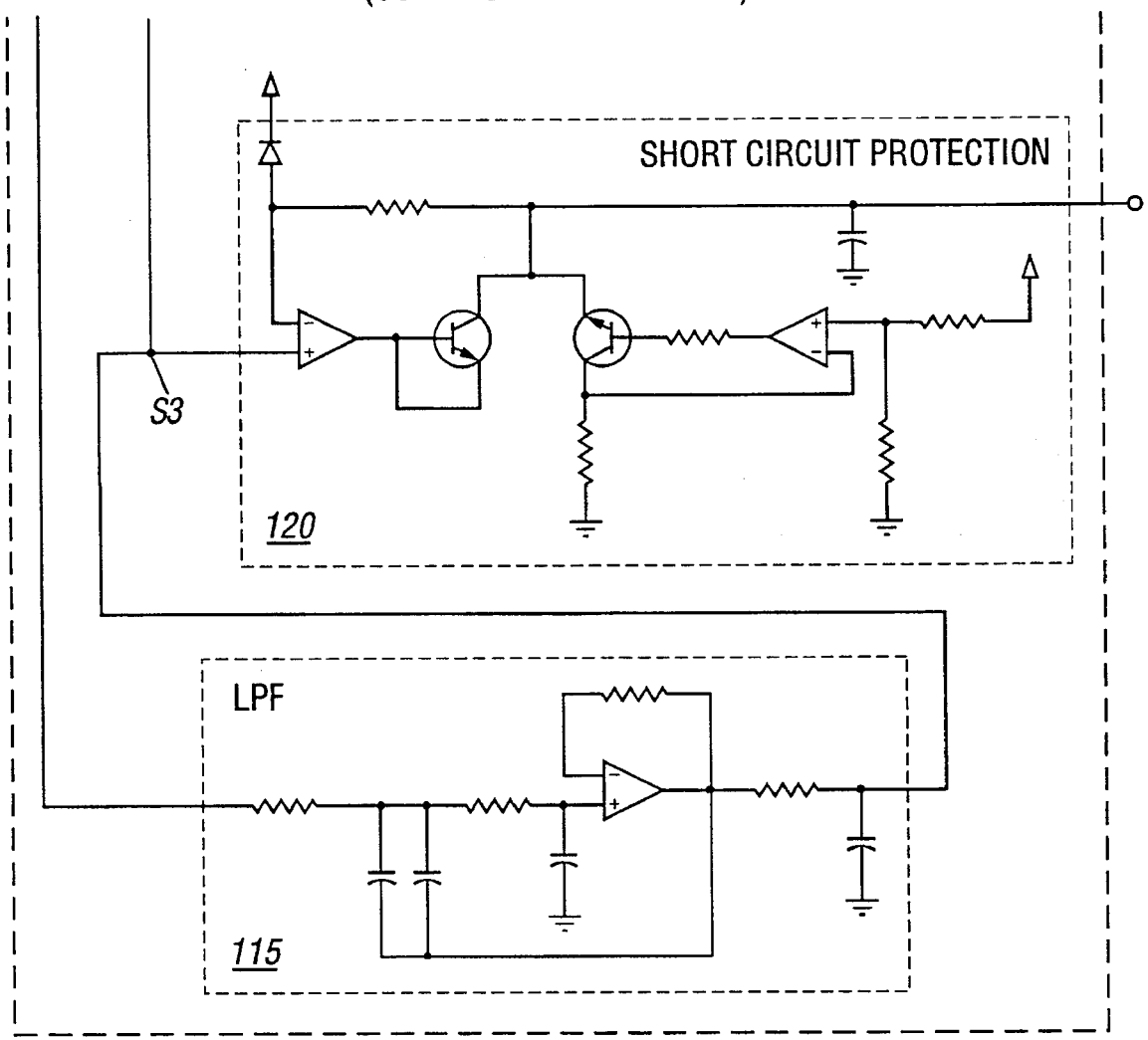
Figure 6:
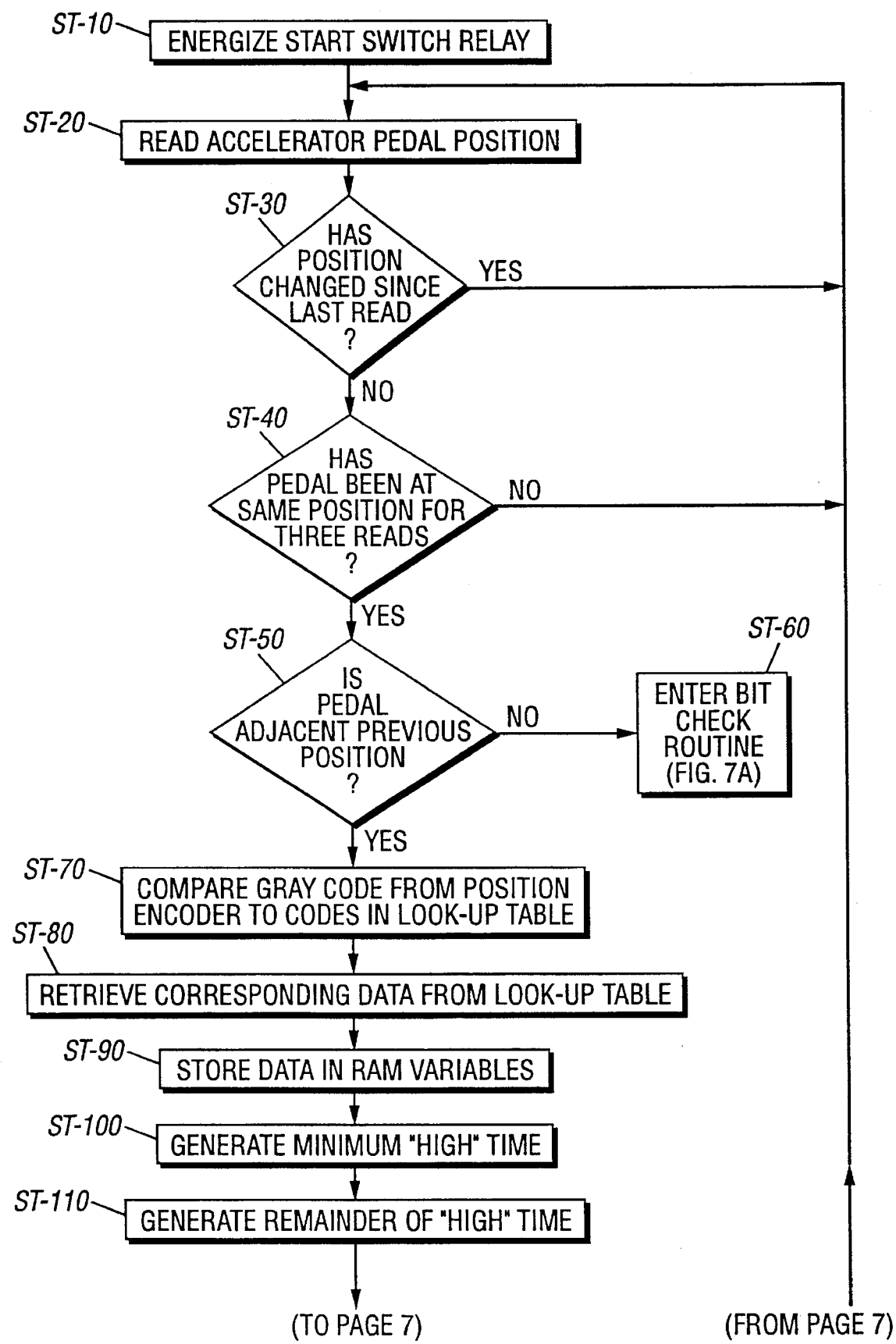
FIG. 6 is a flow diagram for normal operation of the control mechanism of FIGS. 4 and 5.
Figure 6:
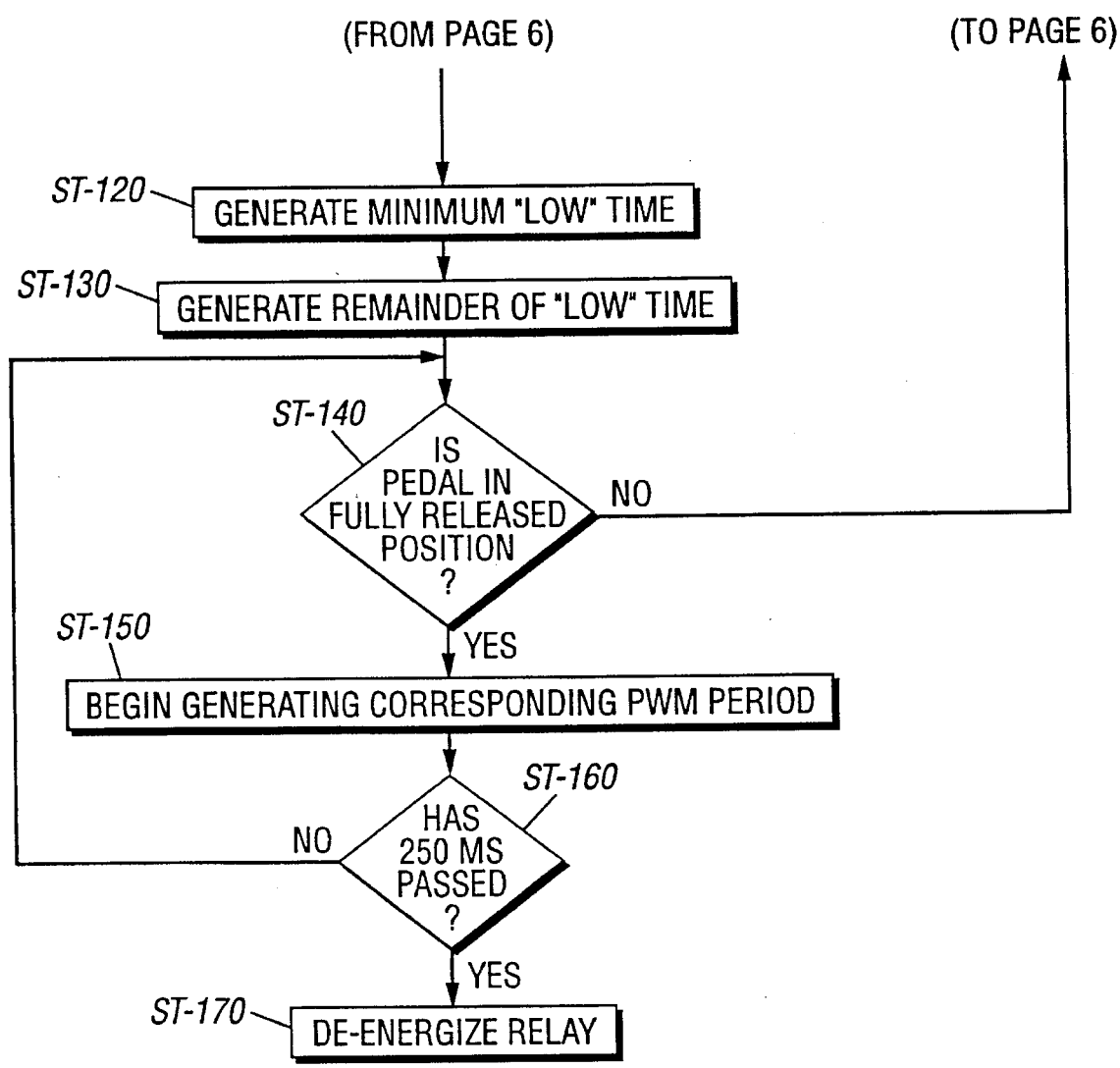

Referring to FIGS. 5 and 6, normal operation of the accelerator controller 100 begins when the start switch relay 135 is energized (ST-10). The relay 135 is energized when a high voltage signal S4 from the processor 105 drives a transistor 136 which, when turned on, pulls current through the relay coil 137. To open the relay 135, and thus disable the start switch, the processor 105 turns off the transistor 136 by pulling the output signal S4 to a low voltage.

The transistor 136 may also be turned off by the undervoltage protection circuit 130. When the voltage level of the analog output signal S3 falls below the threshold voltage, as determined by a resistor divider 131, a comparator 132 outputs a high signal S5 to the base of a normally-off transistor 133. The collector of transistor 133 is connected to the base of the relay-energizing transistor 136. Because transistor 133 is normally-off, it usually has no effect on transistor 136. However, when the comparator 132 outputs a high-voltage signal S5, transistor 133 is driven into saturation, thereby pulling the base of transistor 136 to a low voltage and turning transistor 136 off, regardless of the level of the signal S4 produced by the processor 135.

Figure 1A:
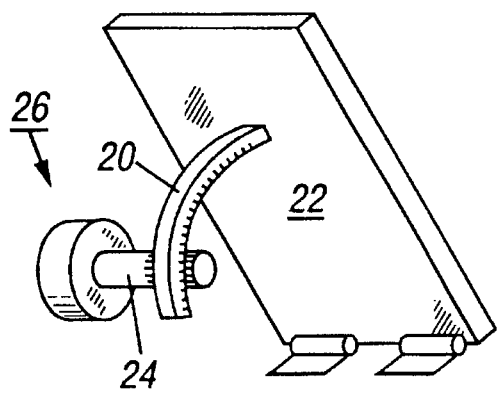
FIGS. 1a, 1b, 2 and 3 show prior art acceleration mechanisms.
Figure 1B:
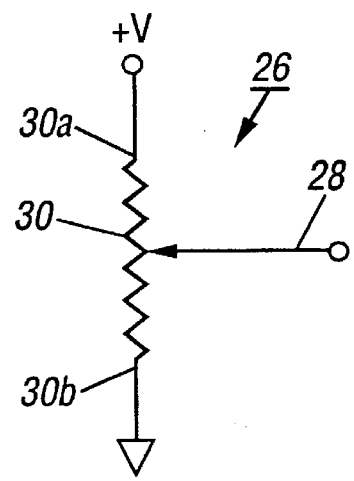
Figure 2:
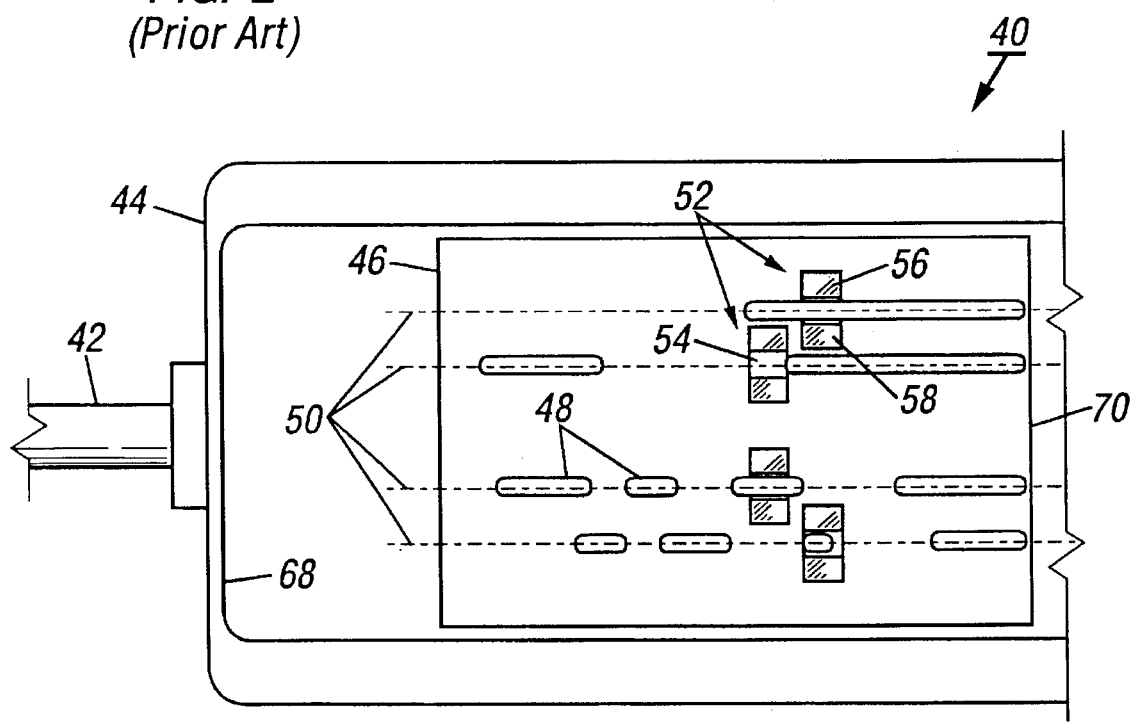
Figure 3:
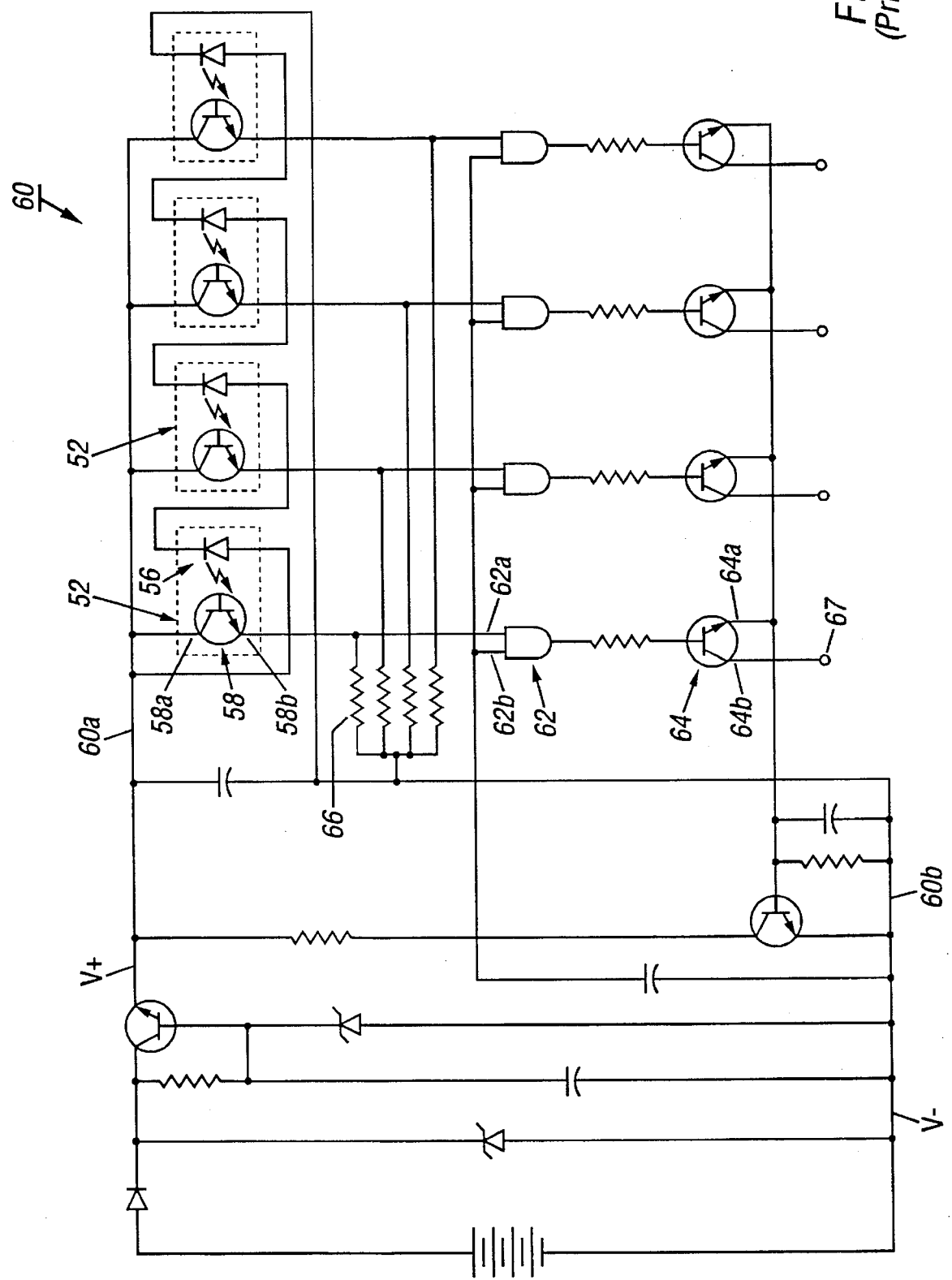

After the vehicle is switched on, the linear position encoder 95 begins to output a digital signal that indicates the position of the accelerator pedal. The preferred linear position encoder 95 is the encoder of FIG. 2, in which four optical switches 96 produce four logic level outputs 98 that make up the multi-bit digital signal S1. Unlike the accelerator controller of FIG. 3, however, the outputs 98 of encoder 95 in the preferred embodiment are connected directly to the processor input port 106. The output leads 98 are also connected to pull-down resistors 102. When the infrared signal within an optical switch 96 is uninterrupted, the corresponding output lead 98 provides a high-voltage (logic "1") to the processor 105. When the infrared signal is interrupted by a vane, or in any other way (e.g., failure of the optical switch), the corresponding pull-down resistor 102 pulls the input lead 98 to a low voltage. Thus, when the accelerator pedal is fully released and a vane protrudes into the passageway of each optical switch, the input port 106 of the processor 105 receives a digital signal having four low (logic "0") bits. As the accelerator pedal is depressed and released, the vanes move through the optical switch in such a way that the output of the encoder follows a gray code sequence, as shown in Table I. Because the linear position encoder outputs a four-bit signal, the accelerator controller 100 recognizes sixteen linear pedal positions during normal operation, fifteen of which are "on" positions and one of which is an "off" position.

TABLE I

Duty Cycle And DC Output Voltage For Each Accelerator Position During Normal Operation

| Accel. Pedal Location | Gray Code | Duty Cycle | High Time | Low Time | Output Voltage As Depressed | Output Voltage As Depressed |
|---|---|---|---|---|---|---|
| P-0 (fully released) | 0000 | 70.0% | 1.40 | 0.60 | 3.573 | 3.573 |
| P-1 | 0010 | 67.0% | 1.34 | 0.66 | 3.377 | 3.377 |
| P-2 | 0011 | 65.5% | 1.31 | 0.69 | 3.295 | 3.295 |
| P-3 | 0001 | 62.8% | 1.26 | 0.74 | 3.165 | 3.165 |
| P-4 | 0101 | 59.3% | 1.19 | 0.81 | 2.991 | 2.991 |
| P-5 | 0100 | 56.5% | 1.13 | 0.87 | 2.842 | 2.842 |
| P-6 | 0110 | 54.0% | 1.08 | 0.92 | 2.720 | 2.720 |
| P-7 | 0111 | 53.0% | 1.06 | 0.94 | 2.668 | 2.668 |
| P-8 | 1111 | 51.3% | 1.03 | 0.97 | 2.581 | 2.581 |
| P-9 | 1101 | 49.5% | 0.99 | 1.01 | 2.490 | 2.490 |
| P-10 | 1100 | 48.0% | 0.96 | 1.04 | 2.414 | 2.414 |
| P-11 | 1110 | 45.0% | 0.90 | 1.10 | 2.260 | 2.260 |
| P-12 | 1010 | 40.0% | 0.80 | 1.20 | 2.000 | 0.475 (bypass) |
| P-13 | 1011 | 32.8% | 0.65 | 1.35 | 1.608 | 0.475 (bypass) |
| P-14 | 1001 | 9.4% | 0.19 | 1.81 | 0.475 (bypass) | 0.475 (bypass) |
| P-15 (fully depressed) | 1000 | 9.4% | 0.19 | 1.81 | 0.475 (bypass) | 0.475 (bypass) |

The digital signal (digital code) S1 created by the linear position encoder 95 is periodically read (ST-20) by the processor 105 from the input port 106. During normal operation, the digital code preferably is read every 75 µs, or every 150 cycles of a 2 MHz internal clock controlled by a 4 MHz oscillator 108. To ensure that the code represents the true position of the pedal, the processor 105 does not accept the code unless it has been read at three consecutive read operations. Each time a code is read, the processor 105 compares (ST-30) the four bits of the code to those obtained in the previous read operation to determine whether or not the pedal position has changed since the last read. If so, the processor 105 awaits the next read operation. If not (i.e., if the four bits match the bits from the last read operation), the processor 105 determines (ST-40) whether or not the pedal has been at the same position for three consecutive read operations.

When the same code has been received for three consecutive read operations, the processor 105 accepts the code and determines (ST-50) if the position of the accelerator pedal represented by the accepted code is adjacent the previous pedal position. This check is necessary to ensure that the bits on all output leads 98 from the encoder 95 are correct. Because the accelerator controller 100 reads the digital signal S1 orders of magnitude more quickly than the operator moves the pedal, successive reads of the digital signal S1 should not produce bit codes representing non-adjacent pedal positions. If non-adjacent positions are detected, the software enters (ST-60) a bit-error detection ("bit-check") routine which checks for open-circuited bits in the digital signal S1. The bit-check routine is described in detail below. If the pedal position is adjacent the previous position, the processor 105 produces one period of a PWM signal according to the accepted bit code.

While it is determining the position of the accelerator pedal, the processor 105 creates a 500 Hz PWM signal corresponding to the pedal position. A PWM signal in the preferred embodiments is a square wave signal in which the duty cycle of each period (pulse-width) depends upon certain factors, e.g., the position of the accelerator pedal.

As shown in Table I, the duty cycle of the PWM signal for each of the sixteen accelerator positions may depend upon whether the operator is depressing or releasing the pedal. As the operator depresses the pedal, the accelerator controller considers the pedal to be fully depressed when it reaches position P-14. The pedal thus has two fully-depressed, or "bypass," positions (P-14 and P-15) as it goes in. However, because the operator may have difficulty (e.g., from physical fatigue) holding the pedal at positions P-14 and P-15 for an extended time, the accelerator controller remains in bypass until the pedal is released to position P-11. In other words, when the operator depresses the pedal, the accelerator controller enters bypass mode (0.4% duty cycle) at position P-14, but does not exit bypass mode until the pedal returns to position P-11. As a result, the operator may operate the vehicle at full-speed without continually holding the pedal in the fully depressed position.

At the preferred signal frequency of 500 Hz, one period of the PWM signal is 2.0 ms in length and consumes 4,000 cycles of the 2 MHz clock. As shown in Table I, when the accelerator pedal is fully released (i.e., at position P-0), the duty cycle of the PWM signal is 70%. For a 70% duty cycle, the pulse must go high for 1.4 ms of the 2.0 ms period and low for the remaining 0.6 ms. When the accelerator pedal is at the bypass positions, the duty cycle is 9.4%, so the pulse is high for only 0.19 ms of the 2.0 ms period.

Referring again to FIG. 6, once the processor 105 has determined the pedal position, it compares (ST-70) the gray code representing the pedal position to the gray code contained in a look-up table 114 (FIG. 4) stored in ROM. When a match is found, the processor 105 retrieves (ST-80) data corresponding to the pedal position from the look-up table 114 and stores (ST-90) the data in RAM variables 113 in RAM 111 (FIG. 4). The RAM variables 113 inform the processor software 112 what the duty cycle of the PWM signal period should be for each pedal position.

Regardless of the position of the accelerator pedal, the PWM signal must go high for a minimum amount of time during each period. The minimum high time (0.19 ms) occurs when the accelerator pedal is at the bypass positions. Thus, when the processor begins a new period of the PWM signal, it holds (ST-100) the PWM signal high for the minimum time of 0.19 ms, or 376 cycles of the 2 MHz clock. The processor 105 then uses the RAM variables 113 to generate (ST-110) the remainder of the high portion of the signal.

When the end of the "high" time is reached, the processor must output a low voltage level for the remainder of the signal period. The processor generates (ST-120) this low voltage level for at least a minimum amount of time, regardless of pedal position. Table I shows that the minimum "low" time of 0.60 ms occurs when the pedal is at position P-0. After the signal has been held low for the minimum time, the processor 105 uses the PWM variables 113 to generate (ST-130) the remainder of the low portion of the PWM signal.

When the period of the PWM signal has been completed, the processor begins the next period based upon the most recent accepted location of the accelerator pedal. If, during generation of the signal period, the accelerator pedal changes locations and remains there for three read operations, the actual position of the pedal is accepted by the processor as the new pedal position. If the actual position of the pedal has not been the same for three read operations, the accepted pedal position does not change, and the processor generates a PWM cycle identical to the cycle just completed.

The processor also provides a relay debounce function that prevents the start switch relay from cycling on and off when the pedal sits at the boundary between position P-0 and position P-1 during several read operations. If the processor 105 determines (ST-140) that the pedal is at the fully released position P-0 at the end of the PWM period, the processor outputs (ST-150) a PWM duty cycle corresponding to the fully-released position P-0. When the pedal has remained (ST-160) at position P-0 for 250 ms, the processor de-energizes (ST-170) the start switch relay. If an accelerator position other than position P-0 is detected before 250 ms expires, the start switch relay remains on. The debounce function prevents the processor from unnecessarily cycling the start switch.

If, at any time during normal operation of the vehicle, the processor reads a digital code from the linear position encoder that does not represent a pedal position the same as or immediately adjacent the previous pedal position, the software enters a bit-check routine that searches for an open-circuited bit in the digital code. As soon as the processor detects an incorrect pedal position, the vehicle is immediately switched off to protect the safety of the operator and the vehicle. The processor then waits for the user to release and depress the accelerator pedal in an attempt to force the vehicle to move. When the operator releases and depresses the pedal, the processor reads in the digital codes corresponding to the first nine pedal positions and uses these codes to determine which, if any, bit is open-circuited. If an open-circuited bit is found, the processor enters one of four bit-failure modes, adjusting the RAM variables to ensure proper operation of the vehicle.

When the bit-check routine is entered, the start switch relay is opened (ST-200) and the digital signal is read (ST-210) from the linear position encoder. The processor does not begin storing codes from the digital signal until the codes indicate (ST-220) a fully released pedal. Thus, because the linear position encoder always outputs four low bits (hex 0) when the pedal is fully released, regardless of which bit, if any, is open-circuited, the processor continues to read the output of the linear position encoder until it reads a code of hex 0. The hex 0 code that initiates storage is the first code stored (ST-230) to memory. The processor then waits (ST-240) for the vehicle operator to press the accelerator pedal by monitoring (ST-250) the code from the linear position encoder until the pedal position changes (ST-260). When the pedal position changes, the code for the new position is stored with the previously stored code. The processor then continues to read and store (ST-270) position codes in this manner until nine position codes have been stored (ST-280). Each of the nine codes, including the code for the fully released position, are stored in memory as four-bit hex bytes.

TABLE II

Output Of Linear Position Encoder During Normal Operation And Bit Failure Modes

| PEDAL POS. | ALL BITS WORKING | | Bit B1 OPEN | | Bit B2 OPEN | | Bit B3 OPEN | | Bit B4 OPEN | |
|---|---|---|---|---|---|---|---|---|---|---|
| P-0 | 0000 | 0 | 0000 | 0 | 0000 | 0 | 0000 | 0 | 0000 | 0 |
| P-1 | 0010 | 2 | 0010 | 2 | 0000 | 0 | 0010 | 2 | 0010 | 2 |
| P-2 | 0011 | 3 | 0010 | 2 | 0001 | 1 | 0011 | 3 | 0011 | 3 |
| P-3 | 0001 | 1 | 0000 | 0 | 0001 | 1 | 0001 | 1 | 0001 | 1 |
| P-4 | 0101 | 5 | 0100 | 4 | 0101 | 5 | 0001 | 1 | 0101 | 5 |

TABLE II-continued

Output Of Linear Position Encoder During Normal Operation And Bit Failure Modes

| PEDAL POS. | ALL BITS WORKING | | Bit B1 OPEN | | Bit B2 OPEN | | Bit B3 OPEN | | Bit B4 OPEN | |
|---|---|---|---|---|---|---|---|---|---|---|
| P-5 | 0100 | 4 | 0100 | 4 | 0100 | 4 | 0000 | 0 | 0100 | 4 |
| P-6 | 0110 | 6 | 0110 | 6 | 0100 | 4 | 0010 | 2 | 0110 | 6 |
| P-7 | 0111 | 7 | 0110 | 6 | 0101 | 5 | 1011 | 3 | 0111 | 7 |
| P-8 | 1111 | F | 1110 | E | 1101 | D | 1011 | B | 0111 | 7 |
| P-9 | 1101 | D | 1100 | C | 1101 | D | 1001 | 9 | 0101 | 5 |
| P-10 | 1100 | C | 1100 | C | 1100 | C | 1000 | 8 | 0100 | 4 |
| P-11 | 1110 | E | 1110 | E | 1100 | C | 1010 | A | 0110 | 6 |
| P-12 | 1010 | A | 1010 | A | 1000 | 8 | 1010 | A | 0010 | 2 |
| P-13 | 1011 | B | 1010 | A | 1001 | 9 | 1011 | B | 0011 | 3 |
| P-14 | 1001 | 9 | 1000 | 8 | 1001 | 9 | 1001 | 9 | 0001 | 1 |
| P-15 | 1000 | 8 | 1000 | 8 | 1000 | 8 | 1000 | 8 | 0000 | 0 |

When the processor has stored nine pedal position codes, the processor compares the pattern of the nine hex codes to expected patterns contained in look-up tables stored in memory. Table II shows the expected output of the linear position encoder during normal operation and during each of the four bit-failure modes. The "All Bits Working" column shows the expected gray code values and the corresponding hex codes for each of the sixteen pedal positions during normal operation. The "Bit B1 Open" column shows the four-bit code that is output by the linear position encoder at each of the sixteen positions when the least significant bit (bit B1) is open-circuited. This column also shows the corresponding hex code for each pedal position. The remaining columns show the linear position encoder output when bit B2, bit B3, or bit B4, respectively, is open-circuited.

TABLE III

Stored Codes For Normal Operation And Bit Failure Mode

| CODE | ALL BITS WORKING | Bit B1 OPEN | Bit B2 OPEN | Bit B3 OPEN | Bit B4 OPEN |
|---|---|---|---|---|---|
| 1 | 0 | 0 | 0 | 0 | 0 |
| 2 | 2 | 2 | 1 | 1 | 2 |
| 3 | 3 | 0 | 5 | 3 | 3 |
| 4 | 1 | 2 | 4 | 2 | 1 |
| 5 | 5 | 0 | 5 | 0 | 5 |
| 6 | 4 | 4 | D | 2 | 4 |
| 7 | 6 | 6 | C | 3 | 6 |
| 8 | 7 | E | 8 | 1 | 7 |
| 9 | F | C | 9 | 0 | 5 |

Table III shows all of the possible hex code patterns for the first nine pedal positions when the software enters the bit-check routine. Because the processor does not begin to store codes until it detects a hex 0, each of the code patterns in Table III must begin with a hex 0. If the bit-check routine is entered when all bits are working, the processor begins storing codes when the accelerator pedal reaches position P-0 and, as the operator presses the pedal, continues to store codes until the pedal reaches position P-8.

The pattern of codes stored when bit B1 goes open-circuited is determined somewhat differently, however. As discussed above, the processor does not enter the bit-check routine until it detects a digital code representing a pedal position which is not the same as or adjacent the previous position. Thus, the bit-check routine is first entered only when an unexpected pedal position is detected during normal (all bits working) operation. Once in the bit-check routine, the processor does not begin storing codes until it reads a hex 0. When bit B1 goes open, the first hex 0 read by the processor does not represent position P-0, but rather position P-3. The reason for this is found in Table II.

When all bits are working the hex code for pedal positions P-0 and P-1 is hex 0 and hex 2, respectively. When bit B1 is open, the first four pedal position are represented by hex 0, hex 2, hex 2 and hex 0, respectively. Thus, if bit B1 goes open while the pedal is between positions P-0 and P-3, the processor thinks that the pedal is moving between positions P-0 and P-1. It is not until the pedal reaches position P-4, when the processor detects an unexpected change from hex 0 to hex 4, that the bit-check routine is entered and the start switch relay is opened. As the user releases the pedal, the first hex 0 detected by the processor occurs at pedal position P-3. Therefore, the first hex byte read is that of position P-3. As the operator continues to release the pedal, the processor reads in hex 2 at positions P-2 and P-1 as the second byte, and then reads in the hex 0 at position P-0 as the third byte. At this point, the pedal is fully released for the first time since the bit-check routine was entered, but three codes have already been stored. The user then presses the pedal, and the processor reads in the next six digital codes it sees, stopping with the hex C read at position P-9.

A somewhat similar situation occurs when bit B3 becomes open-circuited, except that two distinct nine byte patterns may be read. Table II shows that when bit B3 is open-circuited, the hex code sequence for positions P-0 through P-4 is the same as the sequence for positions P-0 through P-3 when all bits are working. Therefore, if bit B3 goes open while the pedal is between positions P-0 and P-4, the processor will not detect an unexpected hex code until the pedal reaches position P-5. In this situation if, after the vehicle has stopped, the operator begins to release the pedal before the processor begins to await a hex 0, the first hex 0 will be read when the pedal is fully released, and the following eight codes will be read when the operator presses the pedal. The resulting byte pattern is shown on the right side of the "Bit B3 Open" column in Table III.

If, on the other hand, the processor enters the bit-check routine and begins awaiting a hex 0 while the pedal is at or beyond position P-5, the hex 0 at position P-5 will be the first hex 0 read and the hex codes from positions P-4 to P-0 will be the next four codes read. At this point, the pedal will be fully released for the first time since the bit-check routine began, but five hex codes will already have been read. When the operator presses the pedal again, the first four codes encountered will be the last four read by the processor. The resulting byte pattern is shown on the left side of the "Bit B3 Open" column of Table III. Therefore, there are two distinct code patterns which may be read during the bit-check routine when bit B3 goes open. Because of these multiple patterns, the test for bit B3 open-circuited is handled differently than the tests for other open-circuited bits, as discussed in more detail below. When either bit B2 or bit B4 becomes open-circuited, the processor begins reading codes when the pedal is fully released and then reads the next eight hex codes it sees, just as when all bits are working. When bit B4 goes open, the first eight hex codes encountered are identical to those encountered when all bits are working; only the ninth code differs. This is why nine codes are read in the bit-check routine.

TABLE IV

| | Lookup Table To Determine Which, If Any, Optical Switch Is Not Working | | |
|---|---|---|---|
| CODE | Bit B1 OPEN | Bit B2 OPEN | Bit B4 OPEN |
| 1 | 0 | 0 | 0 |
| 2 | 2 | 1 | 2 |
| 3 | 0 | 5 | 3 |
| 4 | 2 | 4 | 1 |

TABLE IV-continued

| | Lookup Table To Determine Which, If Any, Optical Switch Is Not Working | | |
|---|---|---|---|
| CODE | Bit B1 OPEN | Bit B2 OPEN | Bit B4 OPEN |
| 5 | 0 | 5 | 5 |
| 6 | 4 | D | 4 |
| 7 | Not Used | Not Used | 6 |
| 8 | Not Used | Not Used | 7 |
| 9 | Not Used | Not Used | 5 |

Table IV represents the look-up table stored in ROM that is used to determine which, if any, optical switch is not working. Because the hex code pattern for bit B4 open is identical to the pattern for all bits working until the ninth code, all nine codes for bit B4 open are contained in the table. For bit B1 or bit B2 open, however, only a few of the codes are needed. The look-up table is thus created to contain the first six codes expected when either bit B1 or bit B2 is open. Six codes are needed to eliminate the possibility that bit B3 is open (see Table III). Providing six hex codes allows the processor to make an accurate determination of the open bit without consuming unneeded space in memory. No information is contained in the look-up table for bit B3, for reasons discussed below.

Figure 7A:
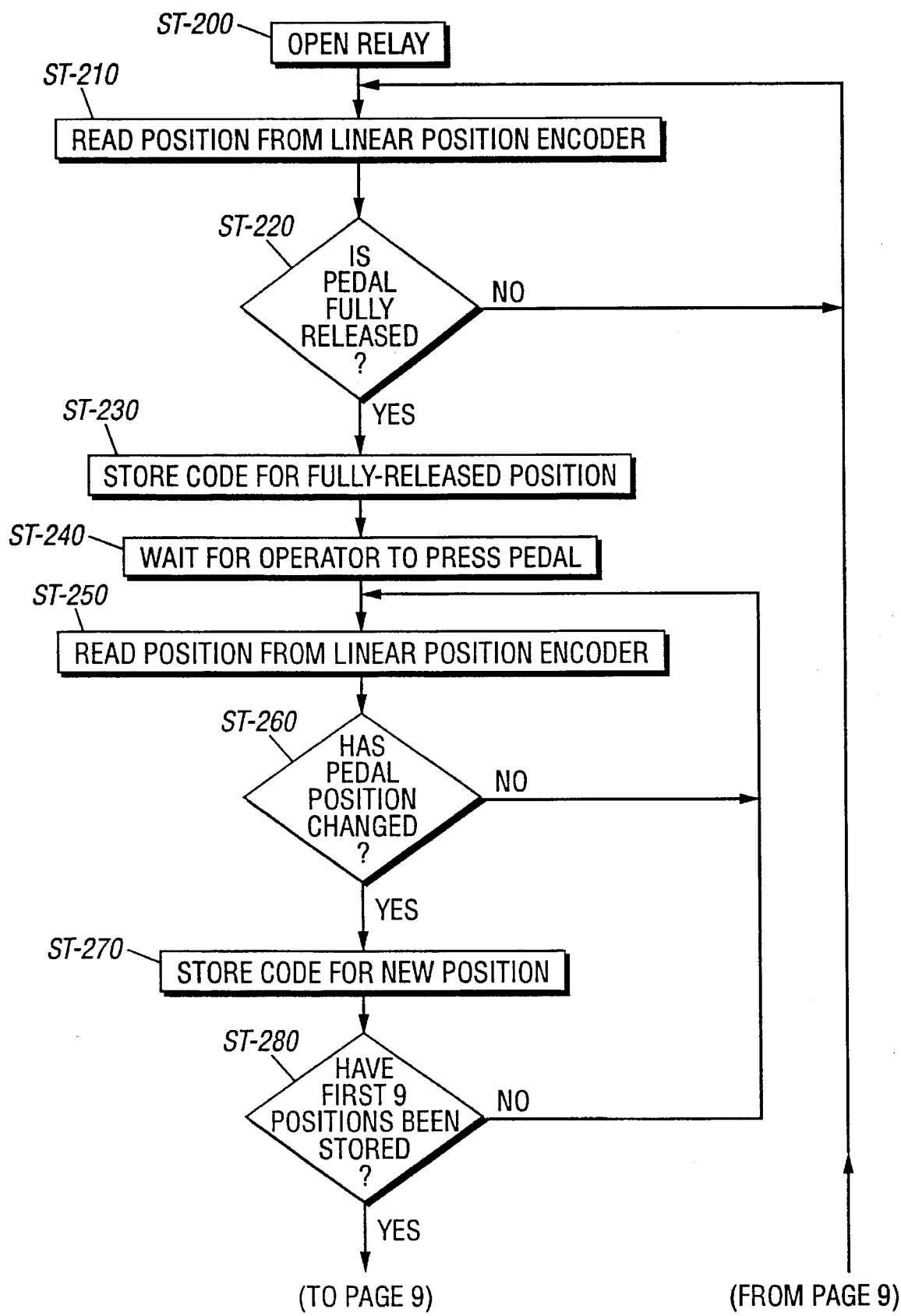
FIGS. 7A through 7C are flow diagrams for operation of the acceleration control mechanism of FIGS. 4 and 5 in bit-error detection modes.
Figure 7A:
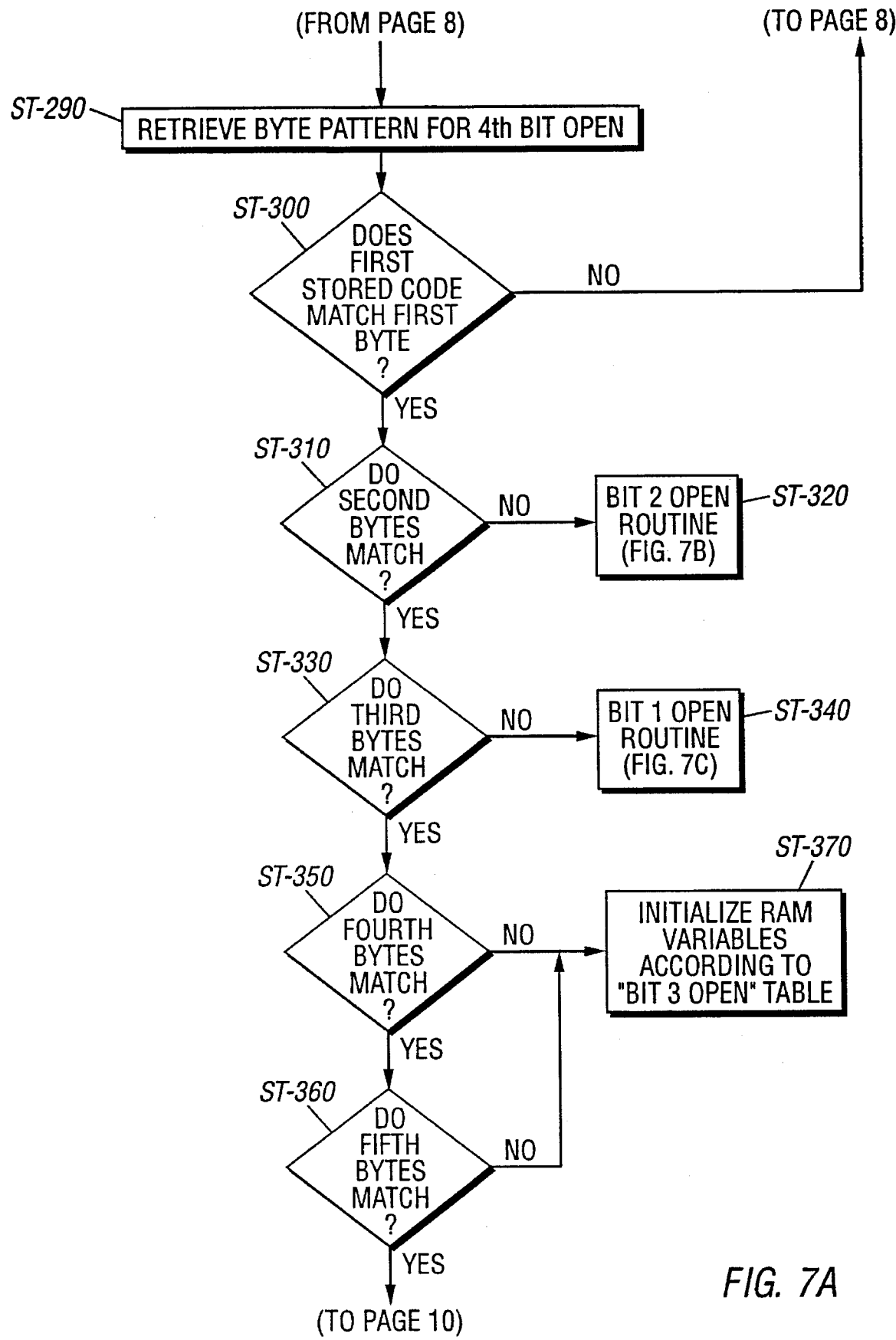
Figure 7A:
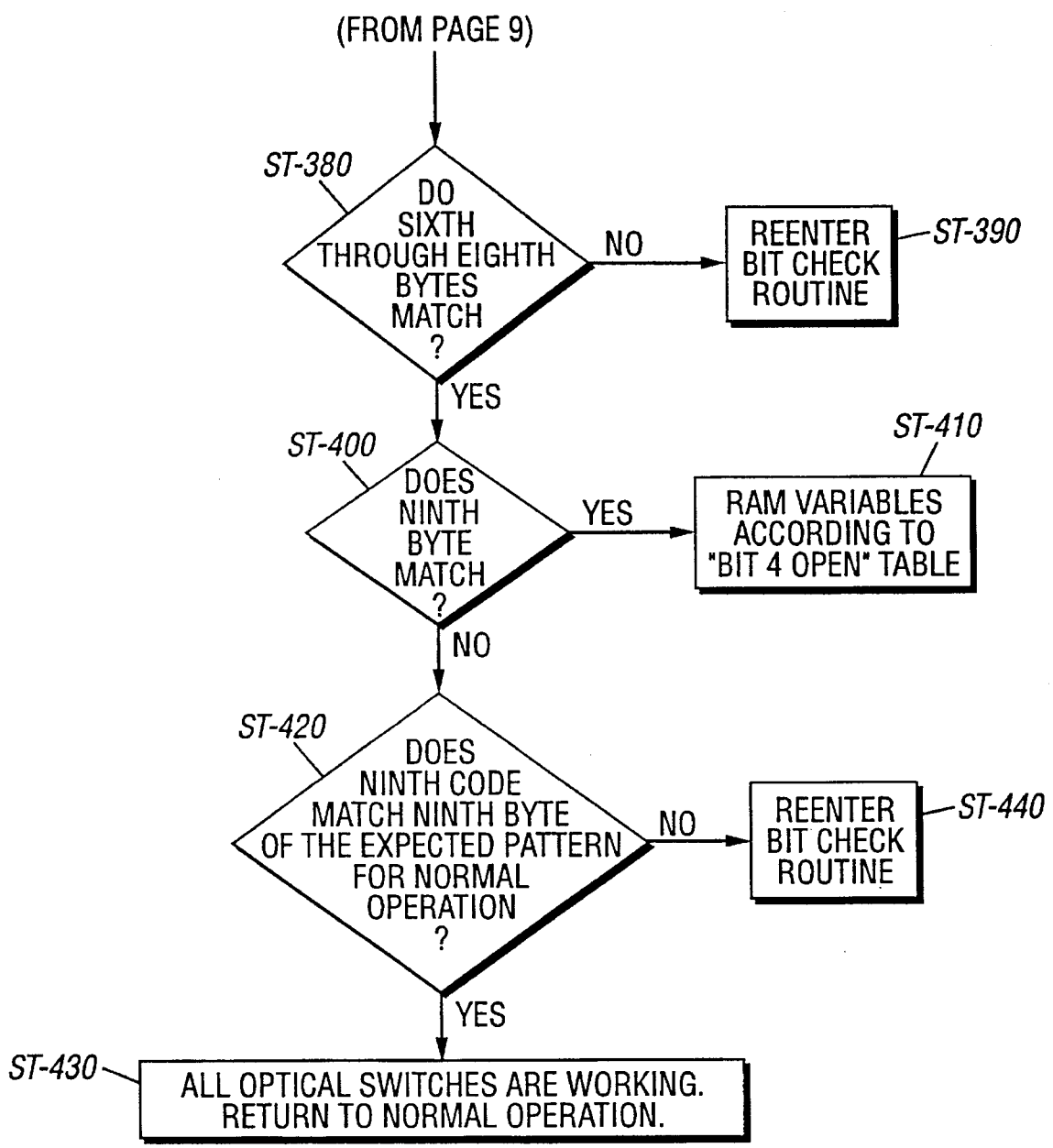

Referring again to FIG. 7A, after the first nine codes have been stored, the processor retrieves (ST-290) from Table IV the expected byte pattern for bit B4 open. The first stored code is compared (ST-300) to the first byte from the table. Because the first stored code should be hex 0 in all cases, the processor returns to the beginning of the bit-check routine and rereads the first nine codes if the first stored code does match the first byte. If there is a match between the first stored code and the first byte from the table, the second code is compared (ST-310) to the second byte from the table. If no match is found, the processor enters (ST-320) a routine to determine if bit B2 is open-circuited.

Figure 7B:
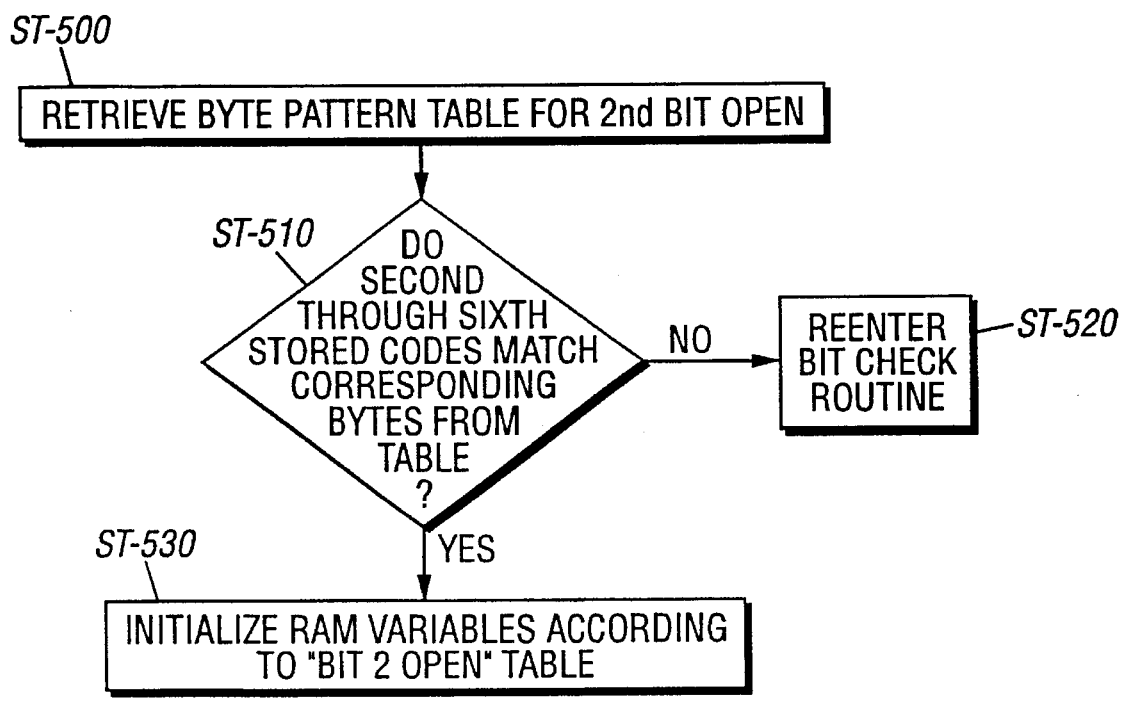

The "Bit B2 Open" routine is shown in FIG. 7B. The first step is to retrieve (ST-500) from the look-up table the byte pattern expected when the second bit is open-circuited. Because the first stored code has already been compared to the first byte, the processor compares only (ST-510) the second through sixth codes to the corresponding bytes from the table. If any of the codes do not match the corresponding byte, the processor returns (ST-520) to the beginning of the bit-check routine. If all the codes do match, the processor initializes (ST-530) the RAM variables for the open-circuited second bit, according to data stored in another ROM look-up table. This look-up table is described in more detail below.

Referring again to FIG. 7A, when the processor finds a match between the second stored code and the corresponding byte in the "Bit B4 Open" column of Table IV, the possibility that bit B2 is open-circuited is eliminated. The processor then compares (ST-330) the third stored code to the third byte and, if no match is found, enters (ST-340) a routine to determine if bit B1 is open-circuited.

Figure 7C:
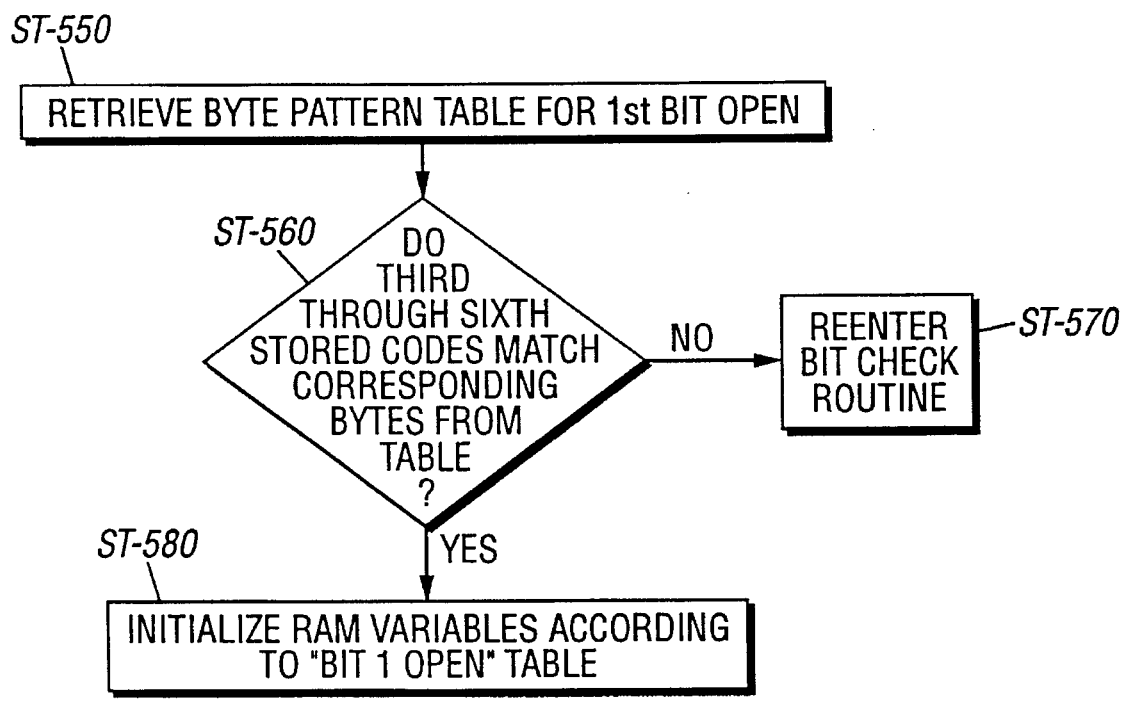

As shown in FIG. 7C, the "Bit B1 Open" routine requires the processor to first retrieve (ST-550) from Table IV the byte pattern expected when bit B1 is open. Since the first two codes have already been checked, the processor compares (ST-560) only the third through the sixth stored codes to the corresponding bytes from the table. If any of the codes do not match the corresponding byte, the processor returns (ST-570) to the beginning of the bit check routine. If all the codes do match, the RAM variables are initialized (ST-580) according to data obtained from the look-up table.

Referring again to FIG. 7A, if each of the first three codes matches the corresponding byte from the "Bit B4 Open" column of Table IV, the fourth and fifth stored codes are compared (ST-350, ST-360) to the corresponding bytes. If either of these codes does not match, it is assumed that the third bit is open-circuited, and the processor initializes (ST-370) the RAM variables to compensate accordingly. If on the other hand, the fourth and fifth bytes do match, the processor has eliminated the possibilities that any bit other than the fourth bit is open-circuited. Thus, when the processor compares (ST-380) the sixth through the eighth stored codes to the corresponding bytes, the bit check routine must be restarted (ST-390) if an unexpected code is found. If the sixth through eighth codes match and the ninth code also matches (ST-400), the processor initializes (ST-400) the RAM variables for an open-circuited fourth bit. If on the other hand, the ninth code does not match the ninth byte from the "Bit B4 Open" table, the processor must determine (ST-420) whether all bits are working or if the pattern of stored codes is erroneous. If the ninth code is hex F, then all bits are working and the processor simply returns (ST-430) to normal operation. Otherwise, the processor reenters (ST-440) the bit-check routine.

Once the processor has determined which bit is open-circuited, it operates in essentially the same manner as it does during normal operation, except that it recognizes only a single bypass position. The processor reads the signal from the linear position encoder, determines if the signal indicates an acceptable position and, if so, uses the corresponding RAM variables to generate a pulse-width modulated signal. Unlike normal operation, however, when one of the bits is open-circuited, the processor no longer recognizes sixteen pedal positions. Instead, if bits B1 or B2 are open, the processor recognizes six positions (five "on" positions and one "off" position); if bit B3 is open, the processor recognizes fourteen pedal positions (thirteen "on" positions and one "off" position); and if bit B4 is open, the processor recognizes fifteen pedal positions (fourteen "on" positions and one "off" position). When the amount of available memory is limited, bit B3 open mode and bit B4 open mode may be limited to fewer recognized positions. In one embodiment, the processor recognizes nine "on" positions and one "off" position when either bit B3 or bit B4 is open.

As shown in the "Bit B1 Open" column of Table II, when bit B1 is open the least significant bit of the output codes can never be high (logic "1"). When the pedal is fully released, the encoder outputs a hex 0, and when the pedal is at position P-1, the encoder outputs a hex 2, as it does when all bits are working. When the pedal moves to position P-2, however, the encoder continues to output a hex 2, and when the pedal moves to position P-3, the encoder again outputs a hex 0. Thus, as the pedal moves from position P-0 to position P-3, the output sequence of the linear position encoder is the same as the output sequence when the pedal moves from position P-3 to position P-0. As a result, when the digital code read by the processor changes from hex 2 to hex 0, the processor cannot discern whether the pedal is moving from position P-1 to position P-0 or from position P-2 to position P-3. The processor must therefore treat all of positions P-0 through P-3 as a single pedal position. The fully-released position in bit B1 open mode is therefore represented by either hex 2 or hex 0.

Table V represents the look-up table that is stored in ROM and used by the processor to determine which hex output codes are expected for each accelerator position in each of the four bit-failure modes. Because multiple pedal positions often must be treated as a single pedal position, each entry in the look-up table is a two digit hex byte (eight bits). When the processor reads a bit pattern from the linear encoder during a bit failure mode, a hex byte is read from the lookup table.

If the first digit of the hex byte is a non-zero value, the processor must determine if the digit is a hex F. If so, the processor ignores the hex byte and selects an adjacent byte from the table. Hex "0F" is used to represent a pedal position that is indistinguishable from an adjacent pedal position in bit failure mode, as discussed above. Hex F is used because the linear encoder can never output hex F (binary "1111") when a bit has failed.

If the first digit of the hex byte is not hex F, the processor compares the bit pattern from the encoder to the first digit. If the bit pattern and the digit match, a PWM period corresponding to the pedal position is created (as described below with reference to Tables VI-A and VI-B). If the bit pattern does not match the first digit, the bit pattern is compared to the second digit of the hex byte. If no match is found, the processor retrieves and adjacent hex byte from the table and compares it to the bit pattern from the linear encoder.

TABLE V

| | Hex Output Codes For Each Accelerator Position In Bit Failure Modes | | | |
|---|---|---|---|---|
| Pedal Position | Bit B1 Open Hex | Bit B2 Open Hex | Bit B3 Open Hex | Bit B4 Open Hex |
| P-1 | 20 | 00 | 00 | 00 |
| P-2 | 0F | 0F | 02 | 02 |
| P-3 | 04 | 01 | 01 | 01 |
| P-4 | 0F | 0F | 0F | 05 |
| P-5 | 0F | 0F | 00 | 04 |
| P-6 | 06 | 54 | 02 | 06 |
| P-7 | 0F | 0F | 03 | 07 |
| P-8 | 0F | 0F | 0B | 0F |
| P-9 | CE | 0D | 09 | 05 |
| P-10 | 0F | 0F | 08 | 04 |
| P-11 | 0F | 0F | 0A | 06 |
| P-12 | 0A | 0C | 0F | 02 |
| P-13 | 0F | 0F | 0B | 03 |
| P-14 | 0F | 0F | 09 | 01 |
| P-15 | 08 | 98 | 08 | 00 |

In the first bit-failure mode (bit B1 open), the table entry for pedal position P-0 is hex "20", the entries for positions P-1 and P-2 are hex "0F" and the entry for position P-3 is hex "04". Thus, when the pedal is at position P-0, the processor creates a PWM signal corresponding to the "off" position. When the pedal moves from position P-0 to position P-1, the encoder output changes to hex 2, which matches the second digit of the table entry for position P-0 (hex "20"). The processor thus continues to produce the PWM signal corresponding to the "off" position P-0. When the pedal moves to position P-2, the encoder output again matches the second digit of the P-0 table entry, and the processor continues to output the "off" signal, as it does when the encoder output changes to hex 0 at pedal position P-3.

When the pedal moves from position P-3 to P-4, the encoder output changes from hex 0 to hex 4 (Table II), which does not match either digit of the P-0 table entry. The processor therefore retrieves the next entry, i.e., the hex "0F" corresponding to position P-1. Because the hex "0F" table entry does not represent an acceptable position, the next entry (hex "0F" at position P-2) is retrieved. This entry also does not represent an acceptable position, so the processor ignores it and retrieves the entry corresponding to position P-3 (hex "04"). The processor then compares the encoder output to the first-digit of the hex byte and, when a match is found, begins to generate a PWM signal corresponding to the first "on" position BF-1 of the first bit failure mode. The same signal is generated when the pedal moves to position P-5.

Table V shows that in the first bit failure mode, six distinct pedal positions are recognized. These positions are consecutively numbered as BF-0 (the "off" position) through BF-5 (the "bypass" position). The same number of positions are recognized in the second bit failure mode (bit B2 open).

When bit B3 is open and bit B4 is open, the processor recognizes a total of fourteen positions and fifteen positions, respectively. In some embodiments, memory constraints may limit the processor to fewer bit-failure positions. In this situation, some positions will have PWM signals with the same duty cycles, which reduces the number of duty cycles available to the PWM output and thus effectively reduces the number of pedal positions. For example, when the accelerator controller is limited to 2 kilobytes of ROM, operation is optimized when the third and fourth modes are limited to ten recognizable pedal position (BF-0 through BF-9).

In the bit-failure modes, the processor reads the digital code at its input port approximately every 175 μs–200 μs and then compares the code to the appropriate column in Table V to determine the position of the accelerator pedal. The time between read operations in the bit-failure mode is considerably longer than that of normal operation because the processor must do more to determine whether the digital code represents an acceptable pedal position, and if so, whether the pedal is at an expected position (i.e., if the pedal position is the same as or adjacent the previous position). The frequency of the PWM signal created by the processor in bit-failure mode is neither constant nor 500 Hz, as it is during normal operation. Once the code has been read and the accelerator position has been determined and accepted, the processor uses the appropriate RAM variables to generate a PWM signal period corresponding to the accelerator position. Tables VI-A and VI-B show the signal frequency, duty cycle, and analog output voltage for each of the acceptable accelerator positions when bit B1 or bit B2 is open and when bit B3 or bit B4 is open, respectively. In all other respects, the accelerator controller functions in the bit-failure modes just as it does in normal operation, including the 250 ms debounce delay when the pedal moves from position BF-1 to position BF-0.

TABLE VI-A

PWM signal frequency, duty cycle and analog output voltage during first and second bit failure modes

| Position | Frequency (Hz) | High Time (ms) | Low Time (ms) | Duty Cycle | Analog Output Voltage |
|---|---|---|---|---|---|
| BF-0 | 326 | 2.05 | 1.01 | 66.99% | 3.403 |
| BF-1 | 376 | 1.64 | 1.01 | 61.89% | 3.133 |
| BF-2 | 376 | 1.44 | 1.22 | 54.13% | 2.748 |
| BF-3 | 376 | 1.24 | 1.42 | 46.62% | 2.364 |
| BF-4 | 375 | 1.05 | 1.62 | 39.33% | 1.981 |
| BF-5 | 375 | 0.24 | 2.43 | 8.99% | 0.466 |

TABLE VI-B

PWM signal frequency, duty cycle and analog output voltage during third and fourth bit failure modes

| Position | Frequency (Hz) | High Time (ms) | Low Time (ms) | Duty Cycle | Analog Output Voltage |
|---|---|---|---|---|---|
| BF-0 | 326 | 2.05 | 1.01 | 66.99% | 3.402 |
| BF-1 | 350 | 1.84 | 1.01 | 64.56% | 3.267 |
| BF-2 | 379 | 1.63 | 1.01 | 61.74% | 3.131 |
| BF-3 | 350 | 1.65 | 1.21 | 57.69% | 2.909 |
| BF-4 | 376 | 1.45 | 1.21 | 54.51% | 2.747 |
| BF-5 | 376 | 1.24 | 1.42 | 46.62% | 2.363 |
| BF-6 | 405 | 1.05 | 1.42 | 42.51% | 2.143 |
| BF-7 | 375 | 1.05 | 1.62 | 39.33% | 1.980 |
| BF-8 | 407 | 0.846 | 1.62 | 34.15% | 1.730 |
| BF-9 | 373 | 0.238 | 2.44 | 8.89% | 0.465 |

Preferred embodiments of the invention have been described in detail above. However, the scope of the invention is not so limited, but instead is limited only by the scope of the appended claims. Those skilled in the art will recognize that numerous additional embodiments and variations of the signal decoder are within the spirit and scope of the invention.

What is claimed is:

1. A signal converter for use with a moveable mechanical device, comprising:

input means for receiving a multi-bit digital signal indicative of a position of the moveable mechanical device;

a processor comprising means for converting said multi-bit digital signal into a pulse-width modulated signal; and a low-pass filter operable to create an analog voltage from said pulse-width modulated signal, said analog voltage corresponding to the position of the moveable mechanical device.

2. The signal converter of claim 1, further comprising memory means for storing data characteristic of said multi-bit digital signal.

3. The signal converter of claim 2, wherein said data characteristic of said multi-bit digital signal comprises a table of binary codes corresponding to all of a plurality of recognizable positions of the moveable mechanical device.

4. The signal converter of claim 2, said processor further comprising means for interpreting said data characteristic of said multi-bit digital signal and means for using said interpreted data to create said pulse-width modulated signal.

5. The signal converter of claim 1, further comprising an undervoltage detector operable to indicate when said analog voltage falls below a threshold voltage level.

6. An electronic decoder for use with a position encoder, said position encoder producing a multi-bit digital code corresponding to a position of a mechanical device, the decoder comprising:

input means for receiving the multi-bit digital code;

a processor comprising pulse-width modulation means for converting said digital code into a pulse-width modulated signal, said pulse-width modulated signal having a period with a duty cycle corresponding to the position of the mechanical device; and a low-pass filter operable to create from the pulse-width modulated signal a decoded analog voltage corresponding to the position of the mechanical device.

7. The electronic decoder of claim 6, wherein the encoder encodes $2^x$ positions, each of said positions represented by a distinct x-bit digital signal, x being an integer greater than zero, said period of said pulse-width modulated signal having one of $2^x$ possible duty cycles, each of said $2^x$ possible duty cycles corresponding to one of said $2^x$ linear positions.

8. The electronic decoder of claim 6 further comprising a memory device containing data characteristic of the position of the mechanical device, wherein said processor comprises:

means for determining the position from said multi-bit digital code;

means for retrieving from said memory device said characteristic data for the position; and means for using said characteristic data to create said pulse-width modulated signal.

9. The electronic decoder of claim 6, wherein the position is an off position, said decoder further comprising means for disabling another electronic device when a multi-bit code corresponding to said off position is decoded.

10. The electronic decoder of claim 6, wherein said processor further comprises:

means for detecting an erroneous bit pattern in said multi-bit digital code, means for determining if said erroneous bit pattern contains an open-circuited bit;

means for defining a new position of the mechanical device when said erroneous bit pattern contains an open-circuited bit;

means for storing data characteristic of said new position; and means for producing said pulse-width modulated signal from said data characteristic of said new position.

11. A method of creating an analog voltage corresponding to a position of a moveable mechanical device, comprising:

receiving a multi-bit digital signal indicative of the position of the moveable mechanical device;

converting said multi-bit digital signal into a pulse-width modulated signal; and creating an analog voltage by filtering said pulse-width modulated signal, said analog voltage corresponding to the position of the moveable mechanical device.

12. The method of claim 11, further comprising storing data characteristic of said multi-bit digital signal in a memory device, said data comprising a table of binary codes corresponding to all of a plurality of recognizable positions of the moveable mechanical device.

13. The method of claim 12, wherein said step of converting the multi-bit digital signal into a pulse-width modulated signal comprises interpreting said data characteristic of said multi-bit digital signal and using said interpreted data to create said pulse-width modulated signal.

14. A method of compensating for open-circuited bits in bit patterns output by a multi-bit position encoding device, each bit pattern representing a position of a mechanical device, the method comprising:

detecting a bit pattern which deviates from expected bit patterns;

finding an open-circuited bit in said deviating bit pattern; and defining new positions corresponding to bit patterns having said open-circuited bit.

15. The method of claim 14, wherein said step of detecting comprises comparing said bit pattern with a table of the expected bit patterns stored in a memory device.

16. The method of claim 14, wherein said step of finding comprises reading a plurality of deviating bit patterns and comparing each of said plurality of deviating bit patterns to at least one table of expected erroneous bit patterns.

17. The method of claim 14, wherein said step of defining comprises retrieving from a memory device a table of bit patterns expected when said open-circuited bit is open-circuited.

18. The method of claim 14 further comprising storing in a memory device data characteristic of each of said new positions, said data being used to create a pulse-width modulated signal when said new positions are encoded by the position encoding device.

19. A method of controlling speed of a vehicle, the vehicle having an accelerator pedal which causes the vehicle to accelerate when depressed and to decelerate when released to a speed corresponding to a position of the pedal, the method comprising:

creating a digital signal having a plurality of digital bits representative of the position of the pedal;

comparing said digital signal to an expected signal;

if said digital signal does not match said expected signal:
determining which of said plurality of digital bits is incorrect, and
selecting one of a plurality of sets of data, said sets of data each containing speed control data accessible only when a corresponding bit in said digital signal is incorrect;

if said digital signal does match said expected signal, selecting another set of data, said other set of data containing speed control data accessible only when each of said bits in said digital signal is correct;

creating a pulse-width modulated signal according to said selected set of data;

filtering said pulse-width modulated signal into an output DC voltage level corresponding to the position of the pedal; and using said output DC voltage level to control the speed of the vehicle.

* * * * *

UNITED STATES PATENT AND TRADEMARK OFFICE
CERTIFICATE OF CORRECTION

PATENT NO.   : 5,574,444

DATED        : November 12, 1996

INVENTOR(S)  : Paul Siefcak

It is certified that error appears in the above-identified patent and that said Letters Patent is hereby corrected as shown below:

Item: [75] of the cover page, insert "Seifcak" with --Siefcak--.

Column 8, line 59, please delete "PWM" and replace it with "RAM".

Column 14, line 32, please insert as the first line of Table V --P-0    20    00    00    00--.

Column 14, line 32, after P-1, please replace "20    00    00    00" with --OF    OF    02    02--.

Column 14, line 33, after the second occurance of OF, please replace "02    02" with "03    03".

Column 15, line 15, please insert a space between the word "B3" and the word "is".

Signed and Sealed this

Twenty-eighth Day of January, 1997

Attest:

BRUCE LEHMAN

Attesting Officer   Commissioner of Patents and Trademarks